United States Patent
Kumano et al.

(10) Patent No.: US 10,574,272 B2
(45) Date of Patent: Feb. 25, 2020

(54) MEMORY SYSTEM

(71) Applicant: TOSHIBA MEMORY CORPORATION, Tokyo (JP)

(72) Inventors: Yuta Kumano, Kawasaki Kanagawa (JP); Kazumasa Yamamoto, Kawasaki Kanagawa (JP); Hironori Uchikawa, Fujisawa Kanagawa (JP); Akira Yamaga, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/909,589

(22) Filed: Mar. 1, 2018

(65) Prior Publication Data

US 2019/0089384 A1    Mar. 21, 2019

(30) Foreign Application Priority Data

Sep. 19, 2017 (JP) ................ 2017-179376

(51) Int. Cl.
| | |
|---|---|
| *H03M 13/00* | (2006.01) |
| *H03M 13/37* | (2006.01) |
| *H03M 13/15* | (2006.01) |
| *H03M 13/11* | (2006.01) |

(Continued)

(52) U.S. Cl.
CPC ....... *H03M 13/3707* (2013.01); *G06F 11/108* (2013.01); *G06F 11/1012* (2013.01); *H03M 13/1108* (2013.01); *H03M 13/1111* (2013.01); *H03M 13/152* (2013.01); *H03M 13/2906* (2013.01); *H03M 13/2927* (2013.01); *H03M 13/3738* (2013.01); *G06F 2211/109* (2013.01)

(58) Field of Classification Search
CPC .......... H03M 13/3707; H03M 13/152; H03M 13/1111; H03M 13/2906; H03M 13/1108; G06F 11/1012; G06F 11/108; G06F 2211/109
See application file for complete search history.

(56) References Cited

U.S. PATENT DOCUMENTS

| | | |
|---|---|---|
| 7,526,710 B2 | 4/2009 | Sawaguchi |
| 8,042,030 B2 | 10/2011 | Kanaoka et al. |
| 8,583,982 B2 | 11/2013 | Kim et al. |

(Continued)

OTHER PUBLICATIONS

U.S. Appl. No. 15/383,569, filed Dec. 19, 2016.

*Primary Examiner* — Samir W Rizk
(74) *Attorney, Agent, or Firm* — Kim & Stewart LLP (57) ABSTRACT

A memory system includes a nonvolatile memory and a memory controller configured to perform reading of a concatenation code from the nonvolatile memory in response to an external command, the memory controller including a decoder circuit which decodes a reception word in the concatenation code. The decoder circuit includes a first external code decoder that performs decoding on an external code portion, an internal code in-error bit estimation unit that performs estimation of an in-error bit on a bit sequence from the first external code decoder, based on a rule for an internal code in the concatenation code, and outputs a set of in-error bits that is obtained by the estimation, and a second external code decoder that performs decoding which uses the set of in-error bits that is output from the internal code in-error bit estimation unit, on the bit sequence from the first external code decoder.

10 Claims, 7 Drawing Sheets

(51) Int. Cl.
*H03M 13/29* (2006.01)
*G06F 11/10* (2006.01)

(56) References Cited

U.S. PATENT DOCUMENTS

| | | |
|---|---|---|
| 8,792,594 B2 | 7/2014 | Vojcic et al. |
| 8,869,000 B2 | 10/2014 | Varnica et al. |
| 9,270,414 B2 | 2/2016 | Shokrollahi et al. |
| 2002/0016944 A1* | 2/2002 | Yoshida ............ H03M 13/2933 714/758 |
| 2009/0193313 A1 | 7/2009 | Kong et al. |
| 2013/0311840 A1* | 11/2013 | Miyata ................... H04L 1/203 714/704 |
| 2017/0104496 A1 | 4/2017 | Zhang et al. |

* cited by examiner

| PAIR OF FLIPPING POSITIONS AT WHICH SYNDROME VALUE IS "0" IN PARITY INSPECTION | (9, 15) | (12, 13) | (10, 14) | (11, 16) |
|---|---|---|---|---|
| SCORE | 6 | 4 | 3 | 3 |

MEMORY SYSTEM

CROSS-REFERENCE TO RELATED APPLICATION

This application is based upon and claims the benefit of priority from Japanese Patent Application No. 2017-179376, filed Sep. 19, 2017, the entire contents of which are incorporated herein by reference.

FIELD

Embodiments described herein relate generally to a memory system.

BACKGROUND

Data that is recorded in a memory device such as flash memory can be read by any one of hard-decision reading (also referred to as hard-bit reading) and soft-decision reading (also referred to as soft-bit reading). In the hard-decision reading, the data that is recorded is read as a bit having a value of "0" or "1". On the other hand, in the soft-decision reading, the data that is recorded is read as information relating to the probability that the data will have a value of "0" or "1".

In an algebraic code in the related art, in a case where the soft-decision reading is performed, decoding that exceeds the number of possible corrections of a code can be performed, but in a case where the hard-decision reading is performed, generally, the decoding that exceeds the number of possible corrections of the code cannot be performed.

DETAILED DESCRIPTION

Embodiments provide a memory system that is capable of performing decoding that ensures a high correction capability when performing hard-decision reading.

In general, according to one embodiment, there is provided a memory system including a nonvolatile memory in which a concatenation code is stored, and a memory controller configured to perform reading of the concatenation code from the nonvolatile memory in response to an external command, the memory controller including a decoder circuit which decodes a reception word in the concatenation code that is read from the nonvolatile memory and outputs a decoded word that is obtained by the decoding. The decoder circuit includes a first external code decoder that performs bounded distance decoding on an external code portion, and outputs a first result of decoding that is obtained by the bounded distance decoding, wherein the external code portion is a bit sequence of an external code in the concatenation code that is coded, an internal code in-error bit estimation unit that performs estimation of an in-error bit on a bit sequence that is the first result of decoding, which is output from the first external code decoder, based on a rule for an internal code in the concatenation code, and outputs a set of in-error bits that is obtained by the estimation, and a second external code decoder that performs decoding which uses the set of in-error bits that is output from the internal code in-error bit estimation unit, on the first result of decoding that is output from the first external code decoder.

A memory system according to an embodiment will be described in detail below with reference to the accompanying drawings. It is noted that embodiments of the present disclosure are not limiting.

With error correcting codes (ECC), an error that is included in data which is read from a storage device can be corrected. For example, with an algebraic code, in a case where hard-decision reading of data recorded in the storage device is performed, in-error bits up to the number of possible corrections, which are determined from a code minimum distance, can be corrected using a bounded distance decoding algorithm. Accordingly, in the following embodiments, when decoding a reception word that is obtained by reading as binary data a concatenation code that uses an algebraic code as an external code and a code which is based on a sparse graph as an internal code, decoding that exceeds the number of possible corrections of the external code is made possible by decoding the external code using information of the internal code. Accordingly, a memory system is realized in which, when performing the hard-decision reading in which reading delay is comparatively small, it is possible to perform decoding that ensures a high correction capability.

First Embodiment

Figure 1:
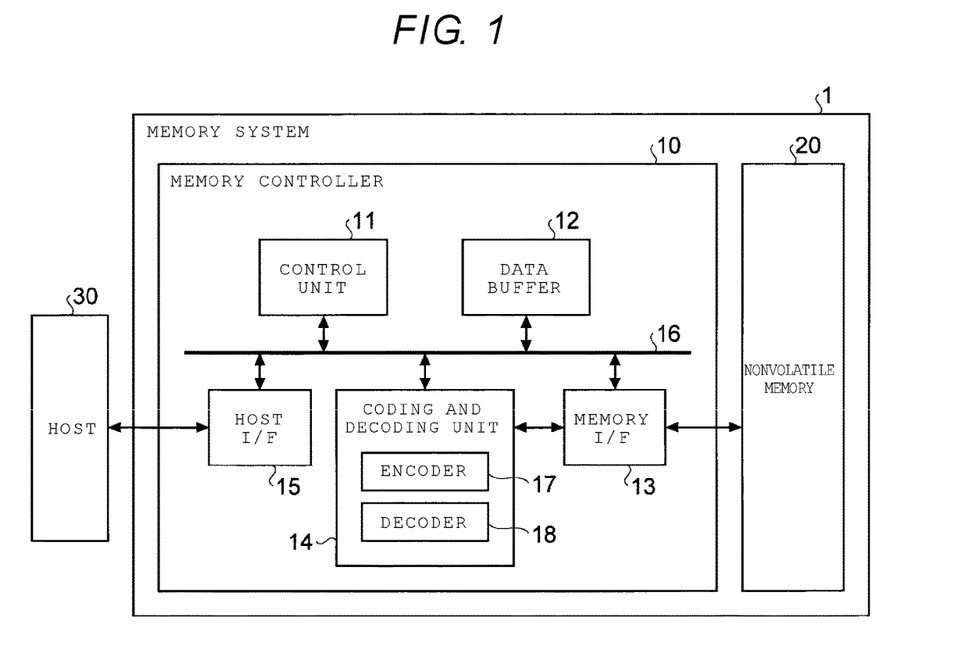
FIG. 1 is a block diagram of a memory system according to a first embodiment.

To begin, a memory system according to a first embodiment will be described in detail below with reference to the drawings. FIG. 1 is a block diagram of the memory system according to a first embodiment. As illustrated in FIG. 1, a memory system 1 includes a memory controller 10 and a nonvolatile memory 20. The memory system 1 may be connected to a host 30. FIG. 1 illustrates a state in which the memory system 1 is connected to the host 30. The host 30, for example, maybe an electronic apparatus, such as a personal computer or a portable terminal.

The nonvolatile memory 20 is nonvolatile memory in which data is stored in a nonvolatile manner, and for example, is NAND flash memory (hereinafter simply referred to as a NAND memory). As an example, a case where the NAND memory is used as the nonvolatile memory 20 will be described below, but it is also possible that a memory device other than the NAND memory, such as a three-dimensionally structured flash memory, a resistance random access memory (ReRAM), or a ferroelectric random access memory (FeRAM), is used as the nonvolatile memory 20. Furthermore, the nonvolatile memory 20 does not have to be a semiconductor memory, and it is possible that the present embodiment is applied to various storage media other than the semiconductor memory.

The memory system 1 may be any one of various memory systems including a so-called solid state drive (SSD), a memory card or the like in which the memory controller 10 and the nonvolatile memory 20 are configured as one package, or the nonvolatile memory 20.

The memory controller 10 controls writing to the nonvolatile memory 20 according to a writing request from the host 30. Furthermore, reading from the nonvolatile memory 20 is controlled according to a reading request from the host 30. The memory controller 10 is a circuit that includes a host interface (host I/F) 15, a memory interface (memory I/F) 13, a control unit 11, a coding and decoding unit (codec) 14, and a data buffer 12. The host I/F 15, the memory I/F 13, the control unit 11, the coding and decoding unit 14, and a data buffer 12 are connected to each other via an internal bus 16.

The host I/F 15 performs processing in compliance with a specification for an interface to the host 30, and outputs a command that is received from the host 30, user data that is a writing target, or the like, to the internal bus 16. Furthermore, the host I/F 15 transmits user data that is read from the nonvolatile memory 20 and restored, a response from the control unit 11, and the like, to the host 30.

Based on an instruction from the control unit 11, the memory I/F 13 performs processing for writing to the nonvolatile memory 20. Furthermore, based on an instruction from the control unit 11, the memory I/F 13 performs processing for reading from the nonvolatile memory 20.

The control unit 11 controls each constituent element of the memory system 1 in an integrated manner. In a case where the control unit 11 receives a command via the host I/F 15 from the host 30, the control unit 11 performs control according to the command. For example, the control unit 11 instructs the memory I/F 13 to write user data and parity to the nonvolatile memory 20 according to a command from the host 30. Furthermore, the control unit 11 instructs the memory I/F 13 to read the user data and the parity from the nonvolatile memory 20 according to a command from the host 30.

Furthermore, in a case where the control unit 11 receives a writing request from the host 30, the control unit 11 determines a storage area for user data that is accumulated in the data buffer 12, in the nonvolatile memory 20. That is, the control unit 11 manages a writing destination of the user data. A correspondence between a logical address of user data that is received from the host 30 and a physical address indicating a storage area in the nonvolatile memory 20, in which the user data is stored is stored as an address conversion table.

Furthermore, in a case where the control unit 11 receives a reading request from the host 30, the control unit 11 converts a logical address designated by the reading request into a physical address using the address conversion table described above, and instructs the memory I/F 13 to perform reading from the physical address.

In the NAND memory, generally, writing and reading is performed on a per-data unit, called a page, and erasing is performed on a per-data unit, called a block. In the present embodiment, a plurality of memory cells that are connected to the same word line are called a memory cell group. In a case where a memory cell is a single level cell (SLC), one memory cell group corresponds to one page. In a case where a memory cell is a multi-level cell (MLC), one memory cell group corresponds to a plurality of pages. Furthermore, each memory cell is connected to a word line and is also connected to a bit line. Therefore, it is possible that each memory cell is identified with an address that identifies the word line and an address that identifies the bit line.

User data that is received by the memory controller 10 from the host 30 is temporarily stored in the data buffer 12 until stored in the nonvolatile memory 20. Furthermore, user data that is read from the nonvolatile memory 20 is temporarily stored in the data buffer 12 until transmitted to the host 30. As the data buffer 12, for example, a general-purpose memory, such as a static random access memory (SRAM) or a dynamic random access memory (DRAM) can be used.

User data that is transmitted from the host 30 is transferred to the internal bus 16 and is temporarily stored in the data buffer 12. The coding and decoding unit 14 codes the user data that is stored in the nonvolatile memory 20, and thus generates a codeword. Furthermore, the coding and decoding unit 14 decodes the reception word that is read from the nonvolatile memory 20, and thus restores the user data. Accordingly, the coding and decoding unit 14 includes an encoder 17 and a decoder 18. It is noted that in addition to the user data, control data that is used within the memory controller 10, or the like may be included in the data that is coded by the coding and decoding unit 14.

Next, write processing according to the present embodiment will be described. The control unit 11 instructs the encoder 17 to code user data when performing the writing to the nonvolatile memory 20. In this situation, the control unit 11 determines a storage location (identified by a storage address) for a codeword in the nonvolatile memory 20, and instructs the memory I/F 13 to perform the writing to the determined storage location as well.

Based on an instruction from the control unit 11, the encoder 17 codes the user data on the data buffer 12 and thus generates a codeword. As a coding scheme, as will be described below, for example, a coding scheme that uses algebraic code, such as a Bose-Chandhuri-Hocquenghem (BCH) code or a Reed-Solomon (RS) code, or a coding scheme that uses a code which is based on a sparse graph, such as a Low-Density Parity-Check (LDPC) code, can be employed. The memory I/F 13 performs control to store the codeword at a storage location on the nonvolatile memory 20, which is determined by the control unit 11.

Next, processing when performing the reading from the nonvolatile memory 20 according to the present embodiment will be described below. When it comes to performing the reading from the nonvolatile memory 20, the control unit 11 designates an address in the nonvolatile memory 20, and instructs the memory I/F 13 to perform the reading. Furthermore, the control unit 11 instructs the decoder 18 to perform decoding. The memory I/F 13 reads the reception word from the designated address of the nonvolatile memory 20 according to an instruction of the control unit 11, and inputs the reception word, which is read, into the decoder 18.

The decoder 18 decodes the reception word, which is read, from the nonvolatile memory 20.

Figure 2:
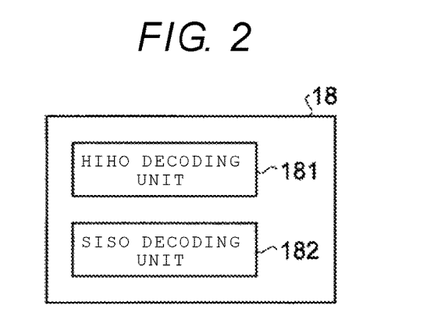
FIG. 2 is a block diagram of a decoder in the memory system according to the first embodiment.

The decoder 18 decodes the reception word that is read from the nonvolatile memory 20. FIG. 2 is a block diagram illustrating an example of a schematic configuration of the decoder 18. As illustrated in FIG. 2, the decoder 18 includes a hard-input hard-output (HIHO) decoding unit 181 that sets a hard-decision value to be an input, performs the decoding, and outputs the hard-decision value as a result of the decoding, and a soft-input soft-output (SISO) decoding unit 182 that sets a soft-decision value to be an input, performs the decoding, and outputs the soft-decision value as a result of the decoding.

Generally, SISO decoding characteristically ensures a higher error correction capability, but a longer processing time than HIHO decoding. Accordingly, in the present embodiment, first, the HIHO decoding unit 181 is configured to perform the HIHO decoding of the reception word that is read as the hard-decision value from the nonvolatile memory 20 and to read as the soft-decision value the reception word that cannot be decoded with hard-decision decoding. Then, the SISO decoding unit 182 is configured to perform the SISO decoding of the reception word that is read as the soft-decision value. However, in the present embodiment, because it is possible to realize a sufficient error correction capability with the HIHO decoding, the SISO decoding may not be needed.

Furthermore, in the present embodiment, the encoder 17 generates a concatenation code in which an algebraic code, such as the BCH code or the RS code, is set to be an external code, and in which a code, such as the LDPC, that is based on the sparse graph is set to be an internal code. The external code is set to be (n, k, d)-code where n is a code length, k is an information length, and d is a minimum distance. In that case, when data that is recorded in the nonvolatile memory 20 is read as data having a hard-decision value of "0" or "1", errors in t (=[(d−1)/2]) bits can be corrected with the bounded distance decoding algorithm. At this point, [x] denotes the largest integer that is equal to or smaller than x. Furthermore, t that is determined by the equation described above is called the number of possible corrections of the code.

Subsequently, a method for the encoder 17 to code a concatenation code will be described. When an information word (e.g., user data) of a certain length is given to the encoder 17, the information word is first coded using an encoder for the external code (hereinafter referred to as an external encoder). Accordingly, a codeword for the external code (hereinafter referred to as an external codeword) is generated. It is noted that a plurality of external encoders may be available to encode a plurality of information words to generate a plurality of external codewords. In that case, each of code lengths, information lengths, and minimum distances of the external codes may be different from each other. Furthermore, the information word may be coded with a code such as a CRC code, the BCH code, or RS code before being coded by the external encoder.

Next, one or more external codewords are input into the encoder for the internal code (hereinafter referred to as an internal encoder), and thus a codeword for the internal code (hereinafter referred to as an internal codeword) is generated. As a result, the codeword in the concatenation code (hereinafter referred to as a concatenation codeword) is generated. It is noted that a plurality of internal encoders may be available to generate a plurality of internal codewords. In that case, each of the code lengths, the information lengths, and the minimum distances of the internal codes may be different from each other.

Figure 3A:
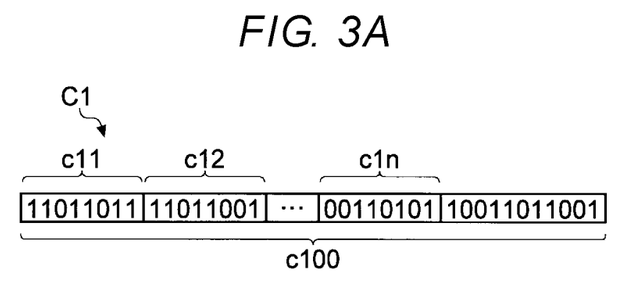
FIG. 3A is a diagram illustrating an example of a concatenation codeword that is generated in the first embodiment.
Figure 3B:
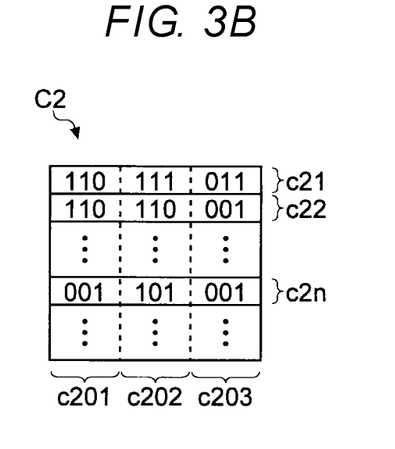
FIG. 3B is a diagram illustrating another example of the concatenation codeword that is generated in the first embodiment.

An example of a configuration of the concatenation codeword that is generated by the encoder 17 with the procedure described above is illustrated in FIGS. 3A and 3B. To begin with, in a concatenation codeword C1 that is illustrated in FIG. 3A, a codeword restriction for the external code is imposed on each of local bit sequences c11, c12, and so forth up to c1n, and so forth. Furthermore, in the concatenation codeword C1, a codeword restriction for the internal code is imposed on a separate local bit sequence c100. On the other hand, also in a concatenation codeword C2 that is illustrated in FIG. 3B, in the same manner, the codeword restriction for the external code is imposed on each of the local bit sequences c21, c22, and so forth up to c2n, and so forth, and the codeword restriction for the internal code is imposed on separate local bit sequences c201 to c203. These concatenation codewords C1 and C2 are recorded as pieces of data in the nonvolatile memory 20 for every bit or in the form on which multi-level modulation is performed. It is noted that according to embodiments of the present disclosure, the imposition of the codeword restriction means being coded.

Subsequently, a method for the decoder 18 to decode the concatenation code is described. Accordingly, a case is assumed in which the concatenation codeword C1 that is illustrated in FIG. 3A is recorded in the nonvolatile memory 20, that concatenation codeword C1 is read as a hard-decision value of "0" or "1", and a reception word is obtained. In such a situation, in some cases, one or more bits in the reception word that is read is inverted from "0" to "1", or from "1" to "0", with the codeword illustrated in FIG. 3A being set to be a reference. In the present description, such bit inversion is called an error. Furthermore, in the reception word (which is equivalent to the concatenation codeword C1) that is read, the local bit sequences (the bit sequences c11, c12, . . . and on which the codeword restriction for the external code is imposed are called an external code portion. Moreover, in the reception word that is read, the local bit sequence (which is equivalent to the bit sequence c100) on which the codeword restriction for the internal code is imposed is called an internal code portion.

Figure 4:
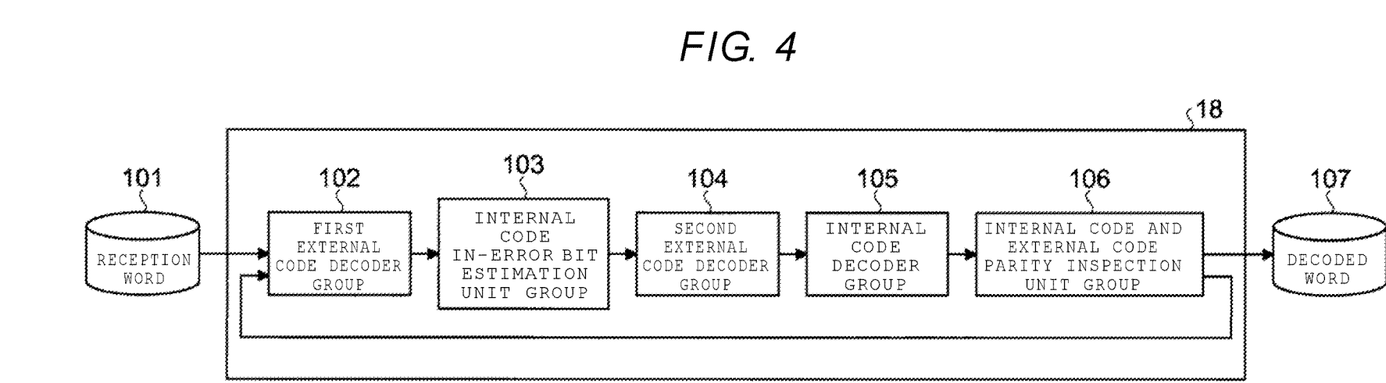
FIG. 4 is a block diagram illustrating additional details of the decoder in the memory system according to the first embodiment.

Subsequently, FIG. 4 illustrates additional details of the decoder in the memory system according to the present embodiment. As illustrated in FIG. 4, the decoder 18 includes a first external code decoder group 102 including one or more first external code decoders, an internal code in-error-bit estimation unit group 103 including one or more internal code in-error-bit estimation units, a second external code decoder group 104 including one or more second external code decoders, an internal code decoder group 105 including one or more internal code decoders, and an internal code and external code parity inspection unit group 106 including one or more internal code and external code parity inspection units.

The first external code decoder group 102 sets a reception word 101 read from the nonvolatile memory 20 or an output from the internal code and external code parity inspection unit group 106 to be an input, and performs bounded distance decoding on the reception word 101 or an external code portion that is output from the internal code and external code parity inspection unit group 106. In some embodiments, the bounded distance decoding need not be performed on the output from the internal code and external code parity inspection unit group 106.

Figure 5:
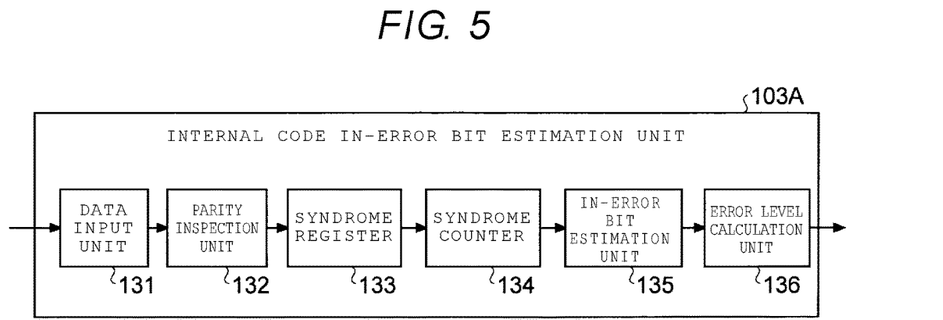
FIG. 5 is a block diagram illustrating an example of a more specific configuration of an internal code in-error bit estimation unit of the first embodiment.

The internal code in-error-bit estimation unit group 103 sets an output of the first external code decoder group 102 to be an input, and performs in-error-bit estimation that is based on a rule for an internal code, on this input. FIG. 5 illustrates an example of a more specific configuration of an individual internal code in-error-bit estimation unit 103A. As illustrated in FIG. 5, the internal code in-error-bit estimation unit 103A includes a data input unit 131, one or more parity inspection units 132, a syndrome register 133, a syndrome counter 134, an in-error-bit estimation unit 135, and an error level calculation unit 136.

The data input unit 131 receives the reception word 101 or the bit sequence, which is the result of the decoding that is obtained by the first external code decoder group 102 performing the bounded distance decoding on the reception word 101, or the output from the internal code and external code parity inspection unit group 106, as an input. The individual parity inspection unit 132 performs a parity inspection of the internal code on the bit sequence that is input. The syndrome register 133 retains one or more syndrome values that are obtained as a result of each parity inspection. The syndrome counter 134 calculates a sum of syndrome values that result from the parity inspection to which each bit is subject.

The in-error-bit estimation unit 135 estimates a bit (hereinafter referred to as an estimation in-error bit that is in error, from the bit sequence, which is input, using the rule for the internal code, and retains and outputs a bit sequence containing the estimation in-error bit. More specifically, the in-error-bit estimation unit 135 estimates that a bit that exceeds a certain threshold is an estimation in-error bit, for the sum of the syndrome values that are retained in the syndrome counter 134, with the certain threshold being set to be a reference, and records and outputs a bit sequence of the estimation in-error bits. It is noted that in the following description, the bit sequence of the estimation in-error bits refers to an estimation in-error-bit sequence, and a group of estimation in-error bits refers to a set of estimation in-error bits.

The error level calculation unit 136 calculates an error level indicating to an estimation in-error bit the degree of likelihood to which an estimation in-error bit will be in error, and records a sequence (hereinafter referred to as an error-level sequence) containing the calculated error level. More specifically, for the estimation in-error bit, the error level calculation unit 136 records and outputs as the error level the sum of the syndrome values that results from the parity inspection to which that bit is subject.

It is noted that the error level is a nonnegative real number or integer, and that it is estimated that the higher the error level, the higher the probability of an error. For this error level, as described above, for example, the sum of the syndrome values that is calculated for every bit can be used. Furthermore, at this point, it is assumed that an error-level threshold T that determines which bit is included in a set of estimation in-error bits is given in advance, and that the internal code in-error-bit estimation unit group 103 includes a bit of which an error level is equal to or higher than the error-level threshold T, in the set of estimation in-error bits.

Figure 6:
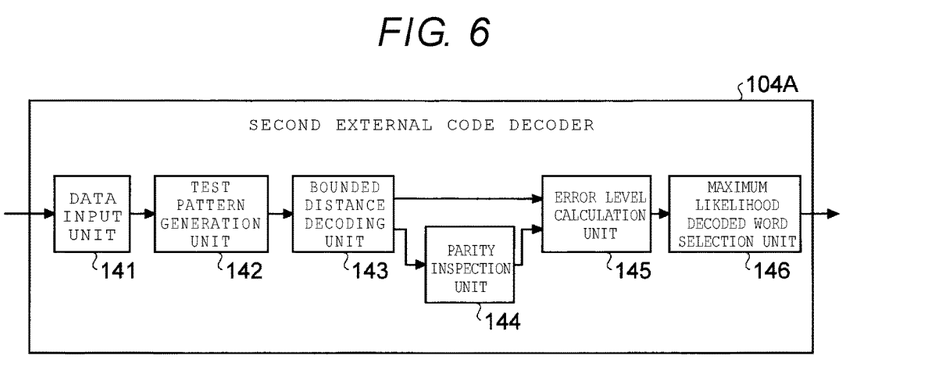
FIG. 6 is a block diagram illustrating an example of a more specific configuration of a second external code decoding unit of the first embodiment.

With reference again to FIG. 4, the description is continued. The second external code decoder group 104 sets the output of the first external code decoder group 102 and the output of the internal code in-error-bit estimation unit group 103 to be an input, and performs the decoding that exceeds the number of possible corrections of the external code, on an external code portion in this input. FIG. 6 illustrates an example of a more specific configuration of the individual second external code decoder 104A. As illustrated in FIG. 6, the individual second external code decoder 104A includes a data input unit 141, a test pattern generation unit 142, a bounded distance decoding unit 143, a parity inspection unit 144, an error level calculation unit 145, and a maximum likelihood decoded word selection unit 146.

The data input unit 141, for example, receives the estimation in-error-bit sequence that is recorded in the in-error-bit estimation unit 135 of the internal code in-error-bit estimation unit 103A and the error-level sequence that is recorded in the error level calculation unit 136, as an input.

The test pattern generation unit 142 creates a bit sequence, that is, one or more test patterns, which results from inverting several bits, with the reception word 101 being set to be a reference, based on the estimation in-error-bit sequence and the error-level sequence that are received by the data input unit 141.

The bounded distance decoding unit 143 performs the decoding that exceeds the number of possible corrections, for example, the bounded distance decoding for the external code, on one or more test patterns that are generated by the test pattern generation unit 142, using the rule for the external code, and selects one or more decoded word candidates from among decoded word candidates that are detected as a result of the decoding. It is noted that the decoded word candidate may be selected, for example, in descending order of the likelihood (each of which indicates the degree to which the decoded word candidate is a correct decoded word) that is obtained from the syndrome value and the like.

The parity inspection unit 144 performs the parity inspection of the external code on one or more decoded word candidates that are selected in the bounded distance decoding unit 143.

The error level calculation unit 145 compares the reception word 101 and each of the decoded word candidates, and thus calculates a sum of error levels of positions at which bit inversion occurs. Alternatively, the error level calculation unit 145 calculates the sum of the error levels of the positions at which the bit inversion occurs, for one or more decoded word candidates that result from the successful bounded distance decoding, with the reception word 101 being set to be the reference. Alternatively, the error level calculation unit 145 calculates the sum of the error levels of the positions at which the bit inversion occurs, for one or more decoded word candidates each of which has a syndrome value of 0 as a result of the parity inspection by the parity inspection unit 144, with the reception word 101 being set to be the reference.

The maximum likelihood decoded word selection unit 146 selects a decoded word candidate that corresponds to the largest sum of the error levels, among the sums of the error levels that are calculated by the error level calculation unit 145, as the most likely decoded word (referred to as a maximum likelihood decoded word), and records and outputs the decoded word candidate.

With reference again to FIG. 4, the description is continued. The internal code decoder group 105 sets an output of the second external code decoder group 104 to be an input, and performs the decoding that is based on the rule for the internal code, on this input. It is noted that, for example, based on a setting that is provided by a user through the host 30, or on various conditions, it may be suitably determined whether or not the internal code decoder group 105 performs the decoding.

The internal code and external code parity inspection unit group 106 sets an output of the internal code decoder group 105 to be an input, and performs the parity inspection on each of the internal code portion and the external code portion in this input. In a case where it is determined that there is no error in the parity inspection of each of the internal code portion and the external code portion, the internal code and external code parity inspection unit group 106 outputs the output of the internal code decoder group 105 as a decoded word 107. On the other hand, in a case where there is an error in the parity inspection of the internal code portion or the external code portion, the internal code and external code parity inspection unit group 106 sets the output of the internal code decoder group 105 to be an input to the first external code decoder group 102. It is noted that, in a case where it is sufficiently guaranteed that there is no error in the user data, it is not necessarily determined that there is no error in the parity inspection of the external code. Furthermore, in a case where, before being coded by the encoder for the external code, user data is coded with the code, such as the CRC code, the BCH code, or the RS code, parity inspections of these are performed, and in a case where it is determined that there is no error in the parity inspection, the output of the internal code decoder group 105 is output as the decoded word 107.

Figure 7:
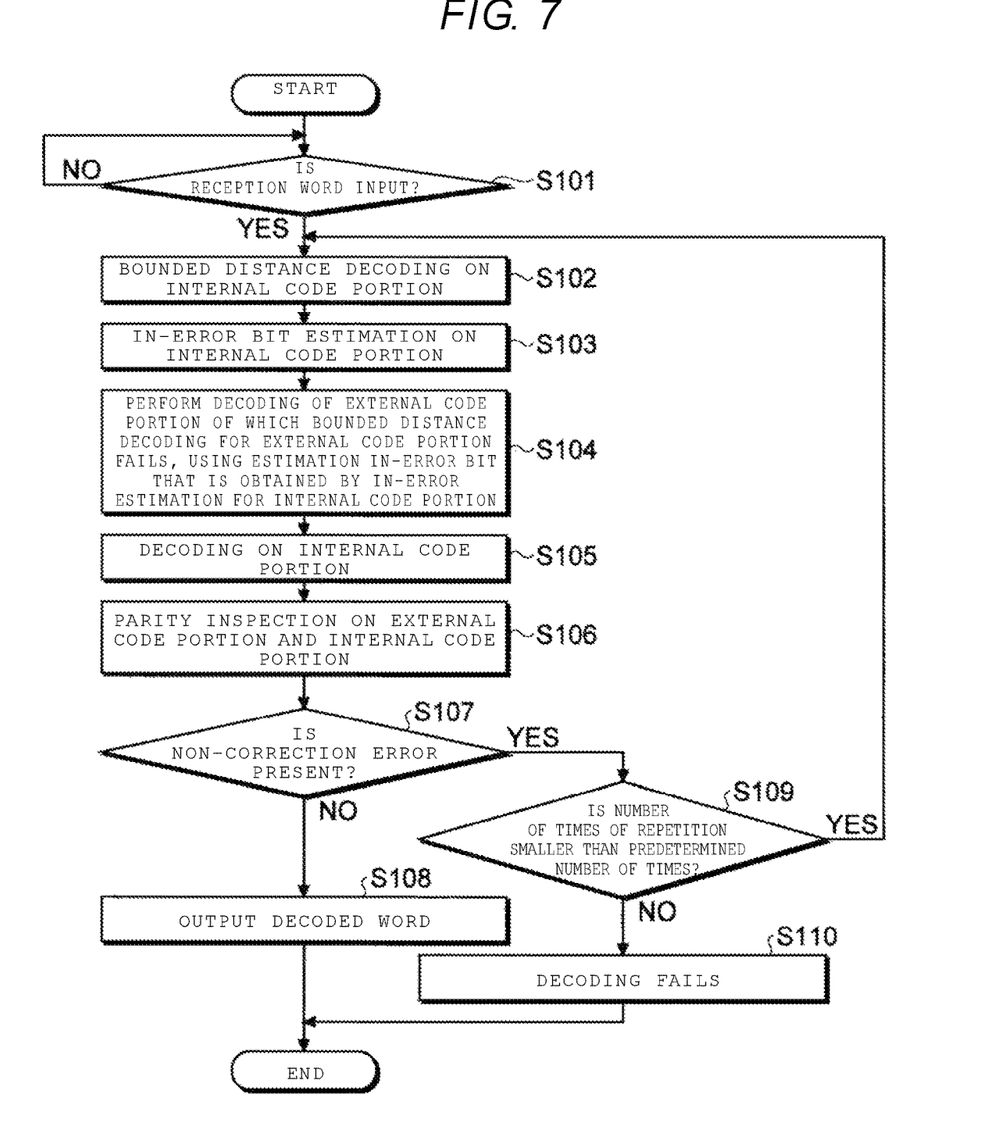
FIG. 7 is a flowchart illustrating an example of a decoding operation according to the first embodiment.

Subsequently, a decoding operation in the decoder 18 according to the present embodiment will be described in detail below with reference to the drawing. FIG. 7 is a flowchart illustrating an example of the decoding operation according to the present embodiment.

As illustrated in FIG. 7, in the decoding operation according to the present embodiment, first, the reception word 101 in the concatenation code that is read by the memory I/F 13 from the nonvolatile memory 20 waits to be input into the decoder 18 (NO in Step S101). When the reception word 101 is input (YES in Step S101), the first external code decoder group 102 performs the bounded distance decoding on the external code portion in the reception word 101 that is input (Step S102). Ina case where the number of errors in the external code portion that is detected by the bounded distance decoding is equal to or smaller than the number of possible corrections, the first external code decoder group 102 can correct the reception word 101 to obtain a correct decoded word. On the other hand, in a case where the number of errors in the external code portion is greater than the number of correctable codes, the following two patterns can be present. In the first pattern, the decoding fails, and a bit sequence of the external code portion before the bounded distance decoding is returned as is, as a result of the decoding. In the second pattern, erroneous correction occurs, and a bit sequence different from the bit sequence of the external code portion that is originally recorded is returned. In this manner, a correct decoded word that results from performing the bounded distance decoding cannot be obtained for any of the two patterns. However, in the present operation, the decoding of the first pattern is set to fail, and the decoding of the second pattern is set not to fail.

The result of the bounded distance decoding in Step S102 is input into the internal code in-error-bit estimation unit group 103. The internal code in-error-bit estimation unit group 103 estimates a position of an in-error bit in the internal code portion, with respect to the bit sequence that is obtained as a result of performing the operation in Step S102 on the reception word 101 in the concatenation code (Step S103). In a process of estimating an in-error bit, an error level indicating the likelihood that each of all bits will be in error is given to each bit. The internal code in-error-bit estimation unit group 103 includes a bit of which an error level is equal to or higher than the error-level threshold T, in a set of estimation in-error bits, based on the error-level threshold T, and outputs the set of estimation in-error bits that is obtained by this inclusion.

The set of estimation in-error bits that are obtained in the internal code in-error-bit estimation unit group 103 is input into the second external code decoder group 104. The second external code decoder group 104 performs the decoding that exceeds the number of possible corrections of the external code, on the external code portion of which the decoding fails in Step S102, using information of the estimation in-error bit that is obtained in Step S103 (Step S104). In the decoding, the second external code decoder group 104 prepares a bit sequence (hereinafter called a test pattern) that results from flipping F bits which are included in the set of estimation in-error bits, with the reception word 101 of the external code portion being set as a reference. When for the reception word 101 of a certain external code portion, the number of estimation in-error bits that are obtained in Step S103 is set to E, the second external code decoder group 104 prepares $_EC_F$ test patterns. However, the number F may be set to any number. The second external code decoder group 104 performs the decoding on these test patterns, using any one of the following two methods.

First Method

Decoding that Uses Parity Inspection

In a first method, the second external code decoder group 104 performs the parity inspection of the external code on all test patterns, and as a result of that parity inspection, sets a test pattern that has a syndrome value of 0, to be a decoded word candidate. In the method, the decoding that exceeds the number of possible corrections can be performed while setting an error correction rate to be comparatively low.

Second Method

Decoding that Uses Bounded Distance Decoding

In a second method, the second external code decoder group 104 performs the bounded distance decoding for the external code on all the test patterns, and sets a test pattern of which the decoding succeeds, to be a decoded word candidate. In the method, even in a case where the number of estimation in-error bits is comparatively small, the decoding that exceeds the number of possible corrections can be performed.

Subsequently, in the operation in Step S104, the second external code decoder group 104 calculates a score for each decoded word candidate that is obtained with any of the two methods described above, in the following manner. To begin in a case where a decoded word candidate including the reception word 101 of the external code portion is obtained, a positional set of the flipped bits is set to be I={$i_1$, $i_2$, and so forth up to $i_f$}. At this point, f is a sum total of the flipped bits. Secondly, a sum S of error levels that are obtained by Equation (1) that follows is calculated, as a score, in a manner that corresponds to a bit position in I.

$$S = \Sigma_{j \ni i} {}^{i_f} e_j \qquad (1)$$

When a score for each decoded word candidate is calculated with the procedure described above, the second external code decoder group 104 selects a decoded word candidate that receives the highest score, as a final external code decoded word, in the operation in Step S104.

The external code decoded word that is finally selected in Step S104 is input into the internal code decoder group 105. The internal code decoder group 105 performs the decoding that uses any one of the following two methods, on an internal code portion in the bit sequence for the external code decoded word that is finally selected in Step S104 (Step S105).

First Method

Normal Decoding

In a first method, the internal code decoder group 105 performs decoding of all bits of the internal code portion, as decoding targets. In the method, a comparatively large number of in-error bits can be corrected.

Second Method

Decoding that Uses Result of External Code

In a second method, the internal code decoder group 105 performs the decoding for the internal code, on the internal code portion, except for the external code portion of which the decoding succeeds in Step S102 or Step S104. In the method, the decoding can be performed while setting the error correction rate to be comparatively low.

The result of decoding for the internal code in Step S105 is input into the internal code and external code parity inspection unit group 106. The internal code and external code parity inspection unit group 106 performs the parity inspection of the internal code portion and the external code portion on the bit sequence that is obtained as a result of the decoding in Step S105 (Step S106). In a case where it is determined that there is no error in the parity inspection of the internal code portion and the external code portion (NO in Step S107), an output of the internal code and external code parity inspection unit group 106 is supplied, as the decoded word 107, from the decoder 18 (Step S108) and the present operation ends. On the other hand, in a case where it is determined that there is an error in the parity inspection of the internal code portion or the external code portion (YES in Step S107), it is determined whether or not the number of times that the operations in the steps from Steps S102 to S106 have been repeated, is smaller than the predetermined number of times that is set in advance (Step S109). In a case where the number of times of the repetition is smaller than the predetermined number of times (YES in Step S109), the present operation returns to Step S102, and the output of the internal code and external code parity inspection unit group 106 is input into the first external code decoder group 102. On the other hand, in a case where the number of times of the repetition reaches the predetermined number of times (NO in Step S109), it is determined that the decoding fails (Step S110) and the present operation ends.

It is noted that, in the operations in FIG. 7, in a case where the decoded word 107 that can be determined as being correct is discovered in steps up to and including Step S104, it is also possible that at least one operation among operations in Steps S105 to S107 is skipped.

Figure 8:
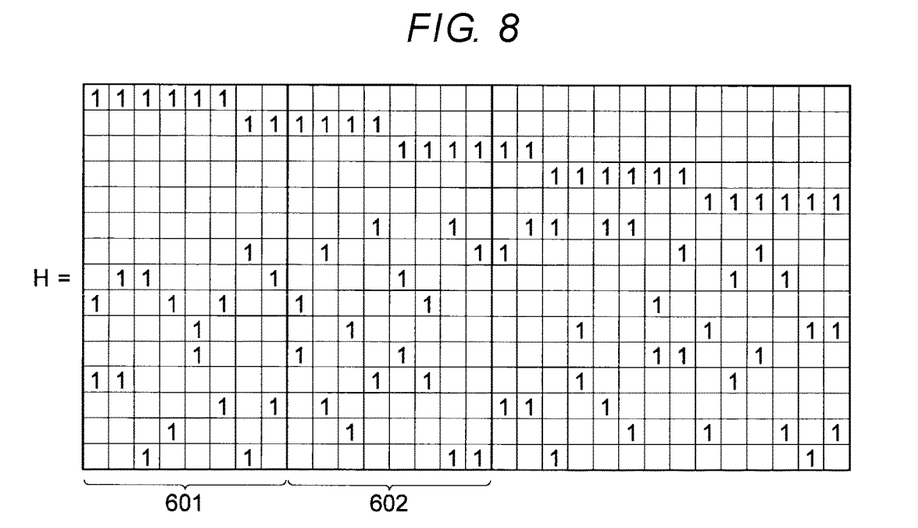
FIG. 8 is a diagram illustrating an example of a parity inspection matrix used in the first embodiment.

Subsequently, the decoding operation according to the present embodiment will be described in detail using a specific example. In the present description, a concatenation code is considered in which an expansion Hamming code with a code length 8, an information length 4, and a minimum distance 4 is set to be an external code and an LDPC code with a code length 30 and an information length 17 is set to be an internal code. At this point, the number of expansion Hamming codes that are the external codes is set to 2. Furthermore, a parity inspection matrix H that is illustrated in FIG. 8 is set to be given as a parity inspection matrix of the LDPC code that is the internal code. However, a blank in FIG. 8 indicates "0", and local bit sequences 601 and 602 each are set to be bit sequences that satisfy a restriction for the external code. Furthermore, it is assumed that in a codeword $c=(c_1, c_2,$ and so forth up to $c_{30})$ in the concatenation code, local bit sequences that are $c'=(c_1,$ and so forth up to $c_8)$ and $c''=(c_9,$ and so forth up to $c_{16})$ satisfy a codeword restriction for the expansion Hamming code that is the external code.

Figure 9:
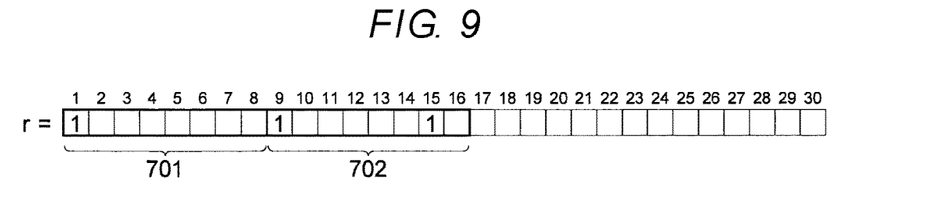
FIG. 9 is a flowchart illustrating an example of a reception word used in the first embodiment.

The parity inspection matrix H for the internal code that is illustrated in FIG. 8 is described. It is noted that a case is assumed where in a description with reference to FIG. 8, the bit sequence, all elements in which are 0, is recorded, as the codeword in the concatenation code, in the nonvolatile memory 20, and when this data that is recorded is read, an error occurs in the first, ninth, and 15-th bits. Under this assumption, a reception word r, as illustrated in FIG. 9, is a bit arrangement that is $r_j=0$ ($j \neq 1, 9, 15$) and $r_1=r_9=r_{15}=1$. However, a blank in FIG. 9 indicates 0 and local bit sequences 701 and 702 each are set to be the bit sequences that satisfy the restriction for the external code. It is noted that numbers from 1 to 30 that are attached to be outside of a frame in FIGS. 9 to 11 indicate addresses of reception bits, respectively.

A decoding operation (equivalent to that in FIG. 7) by the decoder 18 in a case where the reception word r in the bit sequence as illustrated in FIG. 9 is received (Step S101 in FIG. 7) is as follows.

Step S102

Figure 10:
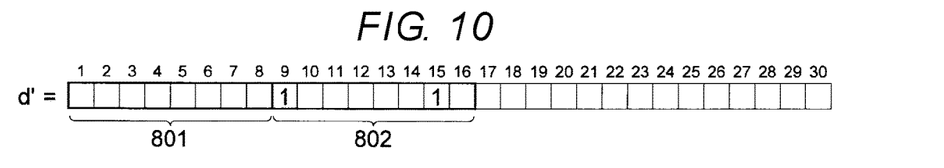
FIG. 10 is a diagram illustrating an example of a bit sequence that is finally obtained as a result of decoding in the decoding operation of FIG. 7.

In Step S102 in FIG. 7, the first external code decoder group 102 performs the bounded distance decoding on an external code portion $r'=(r_1, r_2,$ and so forth up $r_8)$ and $r''=(r_9, r_{10},$ and so forth up to $r_{16})$ of the reception word r, using the expansion Hamming code. In the bounded distance decoding that uses the expansion Hamming code, a one-bit error can be corrected, and a two-bit error can be detected. In other words, in the case of the one-bit error, the decoding succeeds, and in the case of the two-bit error, the decoding fails. Therefore, a reception word r', the number of errors in whose external code portion is 1, is corrected, and the decoding of a reception word r'', the number of errors in whose external code portion is 2, fails. A bit sequence d' that is finally obtained as a result of the decoding in Step S102 is illustrated in FIG. 10. A blank in FIG. 10 indicates 0 and local bit sequences 801 and 802 each are set to be the bit sequences that satisfy the restriction for the external code.

Step S103

In Step S103 in FIG. 7, the internal code in-error-bit estimation unit group 103 performs estimation of an error position for the internal code portion, on a bit sequence d' that is obtained as a result of performing the operation in Step S102 on the reception word r in the concatenation code. Specifically, the parity inspection of the bit sequence d' is performed on the internal code that is determined with the parity inspection matrix H in FIG. 8, and the number of cases where a syndrome value that results from the parity inspection of each bit is not 0 is counted. This procedure can be expressed as follows.

To begin with, a syndrome $s=d'H^T$ is calculated. However, this arithmetic operation is performed in a two element field. Furthermore, $H^T$ expresses transposition of the parity inspection matrix H. Next, the number $u=sH$ of cases where each bit does not pass the parity inspection is calculated. However, this arithmetic operation is performed in an integer field. As a result, a bit in which each of the elements of u is the given error-level threshold T or higher is defined as an estimation in-error bit.

Figure 11:
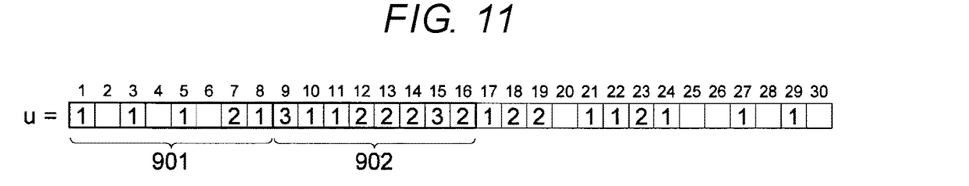
FIG. 11 is a diagram illustrating an example of a symbol sequence that is obtained with a procedure in the decoding operation of FIG. 7.

An example of a symbol sequence u that is obtained with this procedure is illustrated in FIG. 11. However, a blank in FIG. 11 indicates 0 and local bit sequences 901 and 902 each are set to be the bit sequences that satisfy the restriction for the external code. At this point, when the error-level threshold T is set to 2, a set of estimation in-error bits that are obtained as a result of the operation in Step S103 is {7, 9, 12, 13, 14, 15, 16, 18, 19, 23}.

Step S104

Figure 12:
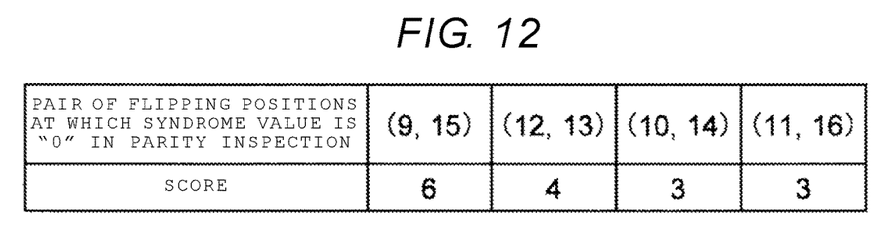
FIG. 12 is a diagram illustrating pairs of bit flipping positions at which a syndrome value is 0.

In Step S104 in FIG. 7, the second external code decoder group 104 performs the decoding that exceeds the number of possible corrections of the external code, on the reception word r″=($r_9$, $r_{10}$, and so forth up to $r_{16}$) of the external code portion of which the decoding fails in Step S102, using the information that is obtained in Step S103. At this point, it is assumed that the decoding that uses the parity inspection that is to be performed on the test pattern, which is illustrated as the first method, is performed. A set of estimation in-error bits in the place in question, which are obtained in Step S103 is {9(3), 12(2), 13(2), 14(2), 15(3), 16(2)}, where a number in parentheses ( ) denotes an error level of each estimation in-error bit. When in practice, the number F of bits that are flipped is set to 2, pairs of flipping positions at which the syndrome value is 0 as a result of the parity inspection of all the test patterns and scores for the decoded word candidates that are obtained as the result of the parity inspection of all the test patterns are as illustrated in FIG. 12. Consequently, it is determined that a flipping set {9, 15} that receives the highest score represents a correction bit position and as a result, the reception word r″ of the external code portion is corrected in Step S104.

Step S105

In Step S105 in FIG. 7, the internal code decoder group 105 performs the decoding on the internal code portion in the bit sequence that is obtained as a result of performing the operation in Step S104. However, in the present specific example, because all errors in the reception word r are corrected by the operations up to and including the operation in Step S104, which are described above, the correction is not performed in Step S105.

Steps S106 to S108

In Step S106 in FIG. 7, the internal code and external code parity inspection unit group 106 performs the parity inspection of the internal code portion and the external code portion on the bit sequence that is obtained as a result of performing the operation in Step S105. In the present specific example, because all the errors in the reception word r are corrected by the operations up to and including the operation in Step S104, it is determined that there is no error in the parity inspection of the internal code portion and the external code portion (NO in Step S107). As a result, in Step S108 in FIG. 7, the bit sequence that is obtained as a result of performing the operation in Step S105 is output as a decoded word.

As described above, according to the present embodiment, when decoding the reception word that is obtained by performing the hard-decision reading of the concatenation code that uses the algebraic code as the external code and the code which is based on the sparse graph as the internal code, decoding that exceeds the number of possible corrections of the external code is made possible by decoding the external code using the information of the internal code. Accordingly, the memory system is realized in which, when performing the hard-decision reading in which the reading delay is comparatively small, it is possible to perform decoding that ensures the high correction capability.

Second Embodiment

In the first embodiment described above, the external code is set to be the algebraic code, such as the BCH code or the RS code, and the internal code is set to be the code that is based on the sparse graph, such as the LDPC code, but no limitation to this combination is imposed. For example, it is also possible that the decoding operation by the decoder according to the first embodiment is performed on a concatenation code in which the external code is set to be the Hamming code or the BCH code, and the internal code is set to be a quasi-cyclic (QC)-LDPC code. However, in this case, it is necessary that a code length of the external code is set to be an integer multiple of a block size of the QC-LDPC code that is the internal code.

When the configuration described above is set to be employed, in the second embodiment, because it is possible that the processing is performed on both the external code and the internal code based on a per-block basis, it is possible that efficient decoding processing is realized.

It is noted that because a configuration of a memory system that includes the decoder according to the present embodiment and operations and effects of the memory system are the same as those in the first embodiment, which are described above, descriptions thereof are not repeatedly described here.

Third Embodiment

In the first embodiment described above, the estimation of the in-error bit is performed based on the rule for the internal code, using the internal code in-error-bit estimation unit group 103, but no limitation to this is imposed. For example, in the configuration in the FIG. 4, instead of the internal code in-error-bit estimation unit group 103, an internal code reliability calculation device group can be used.

The internal code reliability calculation device group sets the reception word 101, the syndrome value, and the output from the internal code and external code parity inspection unit group to be an input, and calculates the reliability of each bit. When a reception word of a target bit, weight of the reception word that is set in advance, a decoded word of the target bit at a point of time for the decoding, and a syndrome value relating to the target bit are set to be r, W, v, and s, respectively, the internal code reliability calculation device group can calculate reliability L of each bit using Equation (2) that follows. It is noted that it is assumed that in Equation (2) that follows, for r, v, and s, two values, that is, {+1, −1}, are used instead of two values, that is, {0, 1}.

$$L = rW + v\Sigma_i s_i \quad (2)$$

The reliability L that is calculated by Equation (2) described above results from quantifying to the degree to which a bit is 0 or to the degree to which the bit is 1, and indicates that the greater a positive value, the greater the likelihood that the bit will be 0 is and that the greater a negative value, the greater the likelihood that the bit will be 1.

In this manner, instead of the internal code in-error-bit estimation unit group 103, the internal code reliability calculation device group is used, and thus in the third embodiment, the decoding that uses the reliability L in a second external code decoding device group 104 can be performed. In this case, the bounded distance decoding and the decoding that exceeds a bounded distance are performed on a reliability hard-decision value. It is noted that the decoding may not be performed on the external code portion that is determined as not having an error, in the first external code decoder group 1, unless a predetermined number of times that repetition decoding is repeated is not reached.

In the decoding that exceeds the bounded distance, the test pattern is generated using the reliability L instead of the error level in the first embodiment. For example, the internal code reliability calculation device group includes a bit of which the reliability L is equal to or lower than a reliability threshold T, in the set of estimation in-error bits, based on the reliability threshold T that is set in advance, and records and outputs the obtained estimation in-error-bit sequence. Along with this, the internal code reliability calculation device group records and outputs a sequence (hereinafter referred to as a reliability sequence) in which the items of reliability L for the estimation in-error bits are arranged side by side along the estimation in-error bit sequence. In contrast, the test pattern generation unit 142 creates a bit sequence, that is, one or more test patterns, which results from inverting several bits, with the reception word 101 or the reliability hard-decision value being set to be a reference, based on the estimation in-error-bit sequence and the reliability sequence that are input.

Because of the decoding that exceeds the bounded distance, which uses the test pattern, is the same as that in the first embodiment, a description thereof is not repeated here.

However, when it comes to the decoded word candidate that is obtained by the decoding that exceeds the bounded distance, which uses the test pattern, a sum of the reliability that is obtained using the reliability L instead of the error level in the first embodiment is calculated for each decoded word candidate.

When the sum of the reliability of each decoded word candidate that is obtained with the procedure described above is calculated, the second external code decoder group 104 selects the decoded word candidate, a sum of whose reliability is the smallest, as a final external code decoded word.

It is noted that because a configuration of a memory system that includes the decoder according to the present embodiment and operations and effects of the memory system are the same as those in the first embodiment, which are described above, descriptions thereof are not repeatedly described here.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a nonvolatile memory in which a concatenation code is to be stored; and
   a memory controller configured to perform reading of the concatenation code from the nonvolatile memory in response to an external command, the memory controller including
   a decoder circuit configured to decode a reception word in the concatenation code that is read from the nonvolatile memory and output a decoded word that is obtained by the decoding, wherein the decoder circuit includes
      a first external code decoder that is configured to perform bounded distance decoding on an external code portion, and output a first result of decoding that is obtained by the bounded distance decoding, wherein the external code portion is a bit sequence of an external code in the concatenation code that is coded,
      an internal code in-error bit estimation unit that is configured to perform estimation of an in-error bit on a bit sequence that is the first result of decoding, which is output from the first external code decoder, based on a rule for an internal code in the concatenation code, and output a set of in-error bits that is obtained by the estimation, and
      a second external code decoder that is configured to generate one or more test patterns from the first result of decoding that is output from the first external code decoder in accordance with the set of in-error bits that is output from the internal code in-error bit estimation unit, perform decoding on the one or more test patterns, and output a second result of decoding on the one or more test patterns, the decoded word being obtained based on the second result of decoding.

2. The memory system according to claim 1, wherein the external code in the concatenation code is an algebraic code and the internal code of the concatenation code is a code that is based on a sparse graph.

3. The memory system according to claim 2, wherein the algebraic code is one of Bose-Chandhuri-Hocquenghem (BCH) code and a Reed-Solomon (RS) code and the code based on a sparse graph is Low-Density Parity-Check (LDPC) code.

4. The memory system according to claim 1, further comprising:
   an internal code decoder that is configured to perform decoding on the second result of decoding that is output from the second external code decoder, based on the rule for the internal code.

5. The memory system according to claim 4, further comprising:
   a first parity inspection unit that is configured to perform parity inspection of the external code portion in a third result of decoding that is output from the internal code decoder and parity inspection of an internal code portion, wherein the internal code portion is a coded bit sequence.

6. The memory system according to claim 1, wherein the internal code in-error bit estimation unit includes
   a data input unit that is configured to receive the first result of decoding which is obtained by the bounded distance decoding that is performed by the first external code decoder on the reception word, as an input,
   a first error level calculation unit that is configured to calculate an error level indicating the degree of likelihood to which each of the estimated in-error bits is in error, and records a sequence of the calculated error levels, and
   an in-error-bit estimation unit that is configured to estimate the in-error bit from the bit sequence that is the first result of decoding which is received by the data input unit, using the rule for the internal code, and retain a bit sequence of the estimated in-error bits.

7. The memory system according to claim 6, wherein the internal code in-error-bit estimation unit further includes
   one or more second parity inspection units that is configured to perform parity inspection of the internal code on the bit sequence which is the first result of decoding that is received by the data input unit,
   a syndrome register in which one or more syndrome values that are obtained as a result of each parity inspection by the second parity inspection unit is configured to be stored, and a syndrome counter that is configured to calculate a sum of the syndrome values which are retained in the syndrome register, for each bit in the bit sequence that is the first result of decoding, wherein the in-error-bit estimation unit is configured to estimate that a bit, for which the sum of the syndrome values which are calculated by the syndrome counter exceeds a predetermined value, is the in-error bit, and wherein the first error level calculation unit is configured to record the sum of the syndrome values that are obtained by the parity inspection to which the in-error bit is subject, as the error level, for each of the in-error bits that are estimated.

8. The memory system according to claim 6, wherein the second external code decoder includes:

a data input unit that is configured to input the bit sequence of the estimated in-error bits that are retained in the in-error-bit estimation unit and the sequence of the error levels which are recorded in the first error level calculation unit;

a test pattern generation unit that is configured to cause one or more bits in the bit sequence to be inverted with the reception word being set to be a reference, based on the bit sequence of the estimated in-error bits and the sequence of the error levels, which are input, to generate the one or more test patterns;

a bounded distance decoding unit that is configured to perform bounded distance decoding on the one or more test patterns, using a rule for the external code, to generate one or more decoded word candidates as the second result of decoding;

a second error level calculation unit that is configured to compare the reception word and each of the one or more decoded word candidates with each other, is configured to specify a position at which bit inversion occurs between the reception word and each of the one or more decoded word candidates, and calculate a sum of error levels at the specified position; and a maximum likelihood decoded word selection unit that is configured to select a decoded word candidate, a sum of whose error levels is the largest among sums of the error levels of the one or more decoded word candidates, as a maximum likelihood decoded word.

9. The memory system according to claim 8, wherein the second error level calculation unit is configured to calculate the sum of the error levels at the position at which the bit inversion occurs, for one or more decoded word candidates that results from the successful bounded distance decoding, with the reception word being set to be the reference.

10. The memory system according to claim 8, further comprising:

a third parity inspection unit that is configured to perform parity inspection of the external code on the one or more test patterns, wherein the second error level calculation unit is configured to calculate the sum of the error levels at the position at which the bit inversion occurs, for one or more decoded word candidates each of which has a syndrome value of 0, as a result of the parity inspection by the third parity inspection unit, with the reception word being set to be the reference.

* * * * *